United States Patent [19]
Alphonse

[11] 3,710,283
[45] Jan. 9, 1973

[54] APPARATUS FOR EFFICIENTLY CONVERTING MICROWAVE ENERGY INTO ACOUSTIC ENERGY

[75] Inventor: Gerard Argant Alphonse, Princeton, N.J.

[73] Assignee: RCA Corporation

[22] Filed: Nov. 18, 1971

[21] Appl. No.: 199,886

[52] U.S. Cl. .................333/30 R, 333/72, 333/98 R, 310/8

[51] Int. Cl. ..............................................H03h 9/00

[58] Field of Search..............333/30, 72, 98 R; 310/8

[56] References Cited

UNITED STATES PATENTS 3,260,969 7/1966 Jacobsen ............................333/72 X

*Primary Examiner*—Herman Karl Saalbach
*Assistant Examiner*—Marvin Nussbaum
*Attorney*—Edward J. Norton

[57] ABSTRACT

Under certain boundary conditions, an evanescent electric field is established in a piezoelectric transducer by a microwave signal incident at the interface between a first dielectric medium and the piezoelectric transducer. The result is an efficient conversion from microwave energy to acoustic energy by the piezoelectric transducer.

7 Claims, 3 Drawing Figures

APPARATUS FOR EFFICIENTLY CONVERTING MICROWAVE ENERGY INTO ACOUSTIC ENERGY

DESCRIPTION OF THE PRIOR ART

Electrical energy can be converted into mechanical energy by a piezoelectric transducer subjected to an applied electric field. Piezoelectric material having the form of a nonconducting crystal exhibits deformation as a result of any applied electric field. Usually the electric field is applied across a pair of electrodes. Mechanical vibrations are generated in the piezoelectric material when the applied electric field is alternating. These vibrations are converted into waves when the piezoelectric material is coupled to a suitable propagating medium. The sound wave frequency is that of the applied electric field.

The type of piezoelectric transducer having a pair of parallel electrodes on opposite piezoelectric surfaces is usually limited to an upper operating frequency of approximately 300 MHz. The frequency limitation is due to the transducer thickness. Optimum conversation efficiency for this type of piezoelectric transducer occurs when the electrodes are separated by a piezoelectric thickness of $\Omega/2$, where $\Omega$ is the acoustic wavelength at the frequency of the applied electric field. Thus, since $\Omega$ is inversely proportional to frequency, the construction of a very thin optimally dimensioned piezoelectric transducer becomes impractical at relatively high microwave frequencies. Acoustic devices employing transducers having a critical thickness greater than $\Omega/2$ have a relatively poor conversion efficiency.

SUMMARY OF THE INVENTION

An apparatus for efficiently converting electromagnetic energy into acoustic energy is described. The apparatus comprises a nonconducting surface of a piezoelectric material of given dielectric constant interfaced with an electromagnetic signal propagating means having a dielectric constant greater than that of the piezoelectric material. The piezoelectric material and propagating means are interfaced in a manner that causes an electromagnetic signal, propagated by said means, to establish an evanescent electric field within the piezoelectric transducer. The piezoelectric's internal evanescent electric field is provided for the efficient conversion of electromagnetic energy to acoustic energy.

DESCRIPTION OF THE PREFERRED EMBODIMENT

Figures 1, 2:
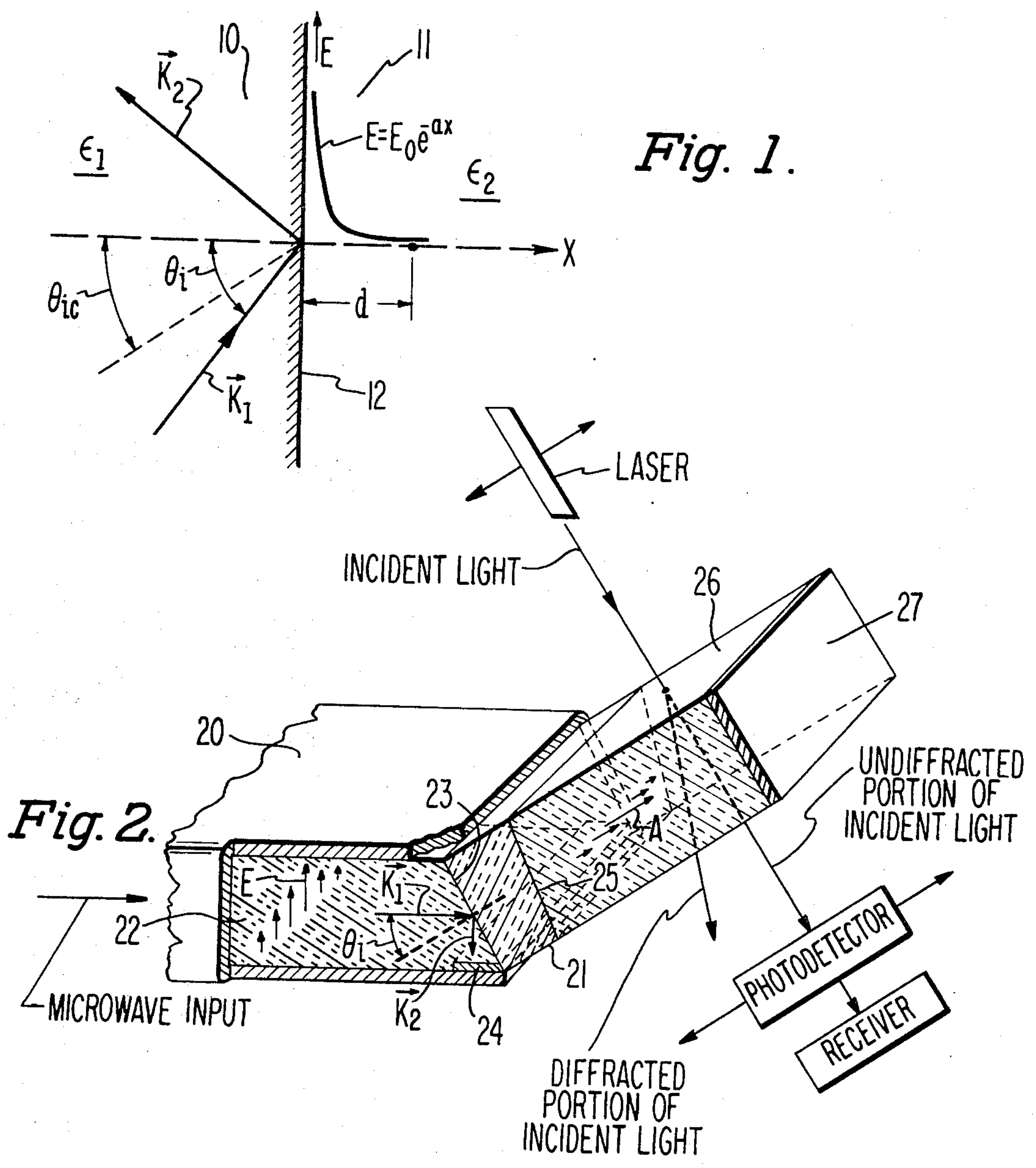
FIG. 1 is a diagram illustrating operating principles useful in an understanding of the invention.
FIG. 2 is an isometric drawing of a microwave acoustic delay line incorporating features of the present invention.

Referring to FIG. 1, there is shown a diagram illustrating the operating principles of an apparatus that efficiently converts electromagnetic or microwave energy into sound waves. A microwave signal is transmitted in a first dielectric medium 10 toward a piezoelectric transducer 11. The direction of microwave transmission is represented by the propagation vector, $\vec{K}_1$. The vector $\vec{K}_1$ is incident at the interface 12 of the first dielectric medium 10 and the piezoelectric transducer 11 at an incident angle, $\theta_i$. The incident angle $\theta_i$ is measured from an axis normal to the interface 12. Part of the microwave energy is reflected at the interface 12 and part is converted into mechanical vibrations. The reflected microwave energy is in the direction of the propagation vector $\vec{K}_2$. Under certain boundary conditions, the microwave signal in the first dielectric medium 10 generates an evanescent electric field in the piezoelectric transducer 11. The attenuation of the evanescent electric field, E, is defined by the equation:

$$E = E_0\, e^{-\alpha x} \qquad (1)$$

where $E_o$ is a constant, $\alpha$ is a variable attenuation constant, and $x$ is the internal piezoelectric depth. A first boundary condition requires that the dielectric constant, $\epsilon_1$, of the first medium 10 be greater than the dielectric constant, $\epsilon_2$, of the piezoelectric transducer 11. A second boundary condition requires that the incident angle, $\theta_i$, exceed a critical angle of incidence $$\theta_{ic} = \sin^{-1} \epsilon_2/\epsilon_1 \qquad (2)$$

where $\epsilon_2$ and $\epsilon_1$ are the respective dielectric constants of the transducer 11 and the first dielectric medium 10. The critical angle of incidence, $\theta_{ic}$, is also measured from an axis normal to the interface 12. The variable attenuation constant, $\alpha$, of the transducer's evanescent electric field is defined by the equation:

$$\alpha = (2\pi\sqrt{\epsilon_1})/(\lambda) \quad \sqrt{\sin^2\theta_i - \epsilon_2/\epsilon_1} \qquad (3)$$

where $\lambda$ is the wavelength at the frequency of the microwave signal, $\epsilon_2$ and $\epsilon_1$ are the respective dielectric constants of the transducer 11 and the first dielectric medium 10, and $\theta_i$ is the incident angle of the microwave signal.

By generating an evanescent electric field within the piezoelectric transducer 11, a difference in electric potential is established between the interface 12 and an internal point $d$ in the piezoelectric material. The point $d$ is located at $\Omega/2$, where $\Omega$ is the acoustic wavelength at the frequency of the microwave signal. Once a sufficient difference in potential is established, over a transducer depth of $\Omega/2$, the available microwave energy incident on the transducer's surface is efficiently converted by the transducer 11 into acoustic energy. One feature of the present invention not found in the prior art is the relative independence of piezoelectric thickness on conversion efficiency. The piezoelectric thickness need only be equal to or greater than $\Omega_m/2$, where $\Omega_m$ is the acoustic wavelength at the lowest frequency of operation. Also, it can be shown by equations (1) and (3) that the difference in potential between the interface 12 and an internal point d in the piezoelectric material is independent of frequency.

The magnitude of the microwave signal converted into acoustic energy is increased by reducing the magnitude of the reflection coefficient, $\gamma$, at the interface 12. The reflection coefficient, $\gamma$, is determined by the equation:

$$\gamma=(Y_L-Y_{in})/(Y_L+Y_{in}) \quad (4)$$

where $Y_L$ is the admittance of the piezoelectric transducer 11 and $Y_{in}$ is the admittance of the dielectric medium 10. For TEM and TM modes of microwave propagation, the admittance of the piezoelectric transducer 11 is $$Y_L=G_p+(j2\pi f\epsilon_2)/(\alpha) \quad (5)$$

where $G_p$ is the equivalent conductance due to the electromechanical conversion, $f$ is the frequency of the microwave signal, $\epsilon_2$ is the magnitude of the relative dielectric constant of the transducer 11, and $\alpha$ is defined by equation (3). The conductance, $G_p$, is a function of transducer density, speed of sound, piezoelectric stress constant and the cross-sectional area of the piezoelectric transducer 11. For the TE mode of microwave propagation, the admittance of the piezoelectric transducer is $$Y_L=G_p-(j\alpha)/(2\pi f\mu) \quad (6)$$

where $\mu$ is the magnetic permeability of the piezoelectric material 11, $G_p$ is the equivalent conductance, $f$ is the frequency of the microwave signal, and $\alpha$ is defined by equation (3).

Referring to FIG. 2, there is shown an isometric drawing of a microwave acoustic delay line using the principles of the disclosed invention. An acoustic wavelength is much shorter than an electrical wavelength at microwave frequencies. This effect is advantageous for the construction of delay lines having relatively long delay times. A microwave input signal, from a source not shown, is coupled directly to a dielectric filled rectangular waveguide 20 terminated by a piezoelectric transducer 21 bonded to the dielectric 22 filling the waveguide 20. One bonding technique is the use of optical cement applied to the interfacing surfaces of the transducer 21 and dielectric 22. The magnitude of the dielectric constant, $\epsilon_1$, of the dielectric 22 filling the waveguide 20 is greater than the magnitude of the dielectric constant, $\epsilon_2$, of the piezoelectric material 21. An example of a suitable waveguide dielectric 22 is rutile with a relative dielectric constant of 900. A suitable piezoelectric transducer 21 is lithium niobate with a relative dielectric constant of 30. The coupled microwave signal is transmitted in the Transverse Electric, $TE_{10}$, mode. The propagation vector $\vec{K_1}$ represents the direction of microwave transmission. The microwave signal is incident at the interface 23 of the dielectric 22 and piezoelectric 21 materials at an angle $\theta_i$. The angle of incidence, $\theta_i$, is measured from an axis normal to the interface 23. The angle of incidence, $\theta_i$, exceeds the critical angle, $\theta_{ic}$, determined by equation (1). Therefore, the necessary boundary conditions are present in order to establish an evanescent electric field within the piezoelectric material 21. The exponential decay of the piezoelectric's evanescent electric field and the resulting potential difference between the interface 23 and an internal point $d$ located at $\Omega/2$, within the piezoelectric transducer 21, permits the conversion from microwave energy to acoustic energy within the piezoelectric material 21. The propagation vector $\vec{K_2}$ represents the direction of the microwave signal reflected at the interface 23. The reflected microwave signal is absorbed by a slab of microwave absorbing material 24. A waveguide matching structure, not shown, minimizes the magnitude of the reflected microwave signal. The impedance of the matching structure appears as the complex conjugate of the transducer 21 impedance at the interface 23. The transducer admittance is defined by equation (6). The piezoelectric surface 25 opposite the interface 23 is non-parallel in order to avoid acoustic standing waves within the transducer 21.

In this embodiment, a $TE_{10}$ mode of microwave propagation creates an electric field transverse to the direction of transmission. The vectors, $\vec{E}$, represent the magnitude and direction of the electric field at a plane within the waveguide 20. The electric field is maximum at the waveguide center and minimum at the narrow dimensioned waveguide walls. The magnitude of the acoustic signal generated in the piezoelectric material 21 is dependent on the magnitude of the piezoelectric's internal electric field. Therefore, the waveform of the microwave electric field, represented by the vectors $\vec{E}$, determine the waveform of the acoustic signal, represented by the vectors $\vec{A}$. The uniform electric field of the TEM mode of electromagnetic propagation would generate an acoustic signal having a uniform waveform.

One surface of a photoelastic medium 26 is interfaced with the surface 25 of the piezoelectric transducer 21. Vacuum indium bonding may be used to interface the photoelastic medium 26 with the transducer 21. The photoelastic medium 26 is a conductor of acoustic waves and light. An example of the photoelastic medium 26 is fused quartz. The light can be the high intensity light generated by a laser. In the absence of acoustic waves, in the photoelastic medium, the incident laser beam is undiffracted. A photodetector is positioned to receive the undiffracted light transmitted through the photoelastic medium. The output signal from the photodetector is coupled to a receiver. In the presence of acoustic energy in the photoelastic medium 26, the incident laser light is diffracted. The photodetector generates a different output signal in response to the diffracted light. The signals monitored by the receiver is information relative to the input microwave signal. There is a time delay between initial microwave signal transmission in the waveguide and reception by the receiver. The time delay is varied by moving the laser light source and photodetector simultaneously along axis parallel to the length of the photoelastic medium 26. Acoustic standing waves in the photoelastic medium 26 is minimized by an acoustic absorber 27 in line with the direction of acoustic transmission and bonded to a surface of the photoelastic medium 26.

Figure 3:
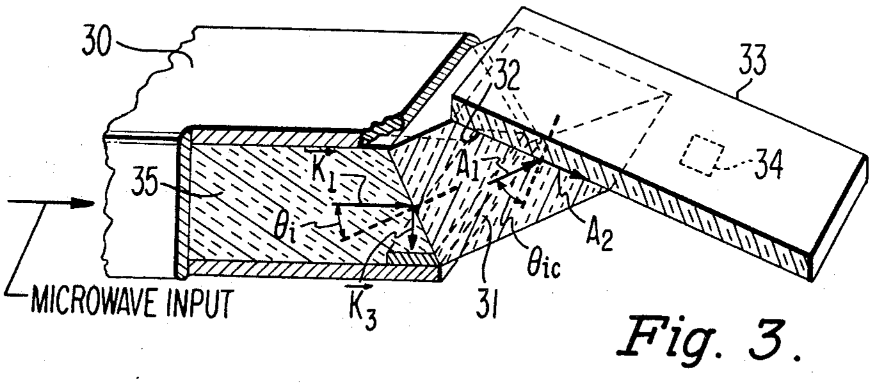
FIG. 3 is an isometric drawing of an apparatus incorporating features of the present invention used to convert a microwave signal into a surface wave acoustic signal.

Referring to FIG. 3, there is shown an apparatus used to efficiently convert a microwave signal into a surface wave acoustic signal. The microwave signal is transmitted in a dielectric filled waveguide 30 terminated by a piezoelectric transducer 31 bonded to the dielectric 35 filling the waveguide 30. Optical cement may be used as the bonding agent between the transducer 31 and dielectric material 35. All previously disclosed boundary conditions necessary for the creation of an evanescent electric field within the piezoelectric transducer 31 are present in FIG. 3. The magnitude of the dielectric constant of the waveguide dielectric material 35 is greater than the dielectric constant of the piezoelectric transducer 31 and the microwave signal is incident on the surface of the transducer 31 at the proper incident angle, $\theta_i$. The mechanical vibrations generated by the piezoelectric transducer 31 as a result of its internal evanescent electric field are transmitted toward the interface 32 of the piezoelectric transducer 31 and an acoustic medium 33. The transducer 31 and acoustic 33 media may be interfaced by vacuum indium bonding. The magnitude of the speed of sound, $V_1$, in the piezoelectric transducer 31 is greater than the magnitude of the speed of sound, $V_2$, in the acoustic medium 33. The vector, $\vec{A_1}$, representing the acoustic signal generated by the transducer 31 is incident at the interface 32 of the piezoelectric transducer 31 and acoustic medium 33 at an incident angle, $\phi_{ic}$. The incident angle, $\phi_{ic}$, is measured from an axis normal to the interface 32. A surface wave acoustic signal, represented by the vector $\vec{A_2}$, is excited on the surface of the acoustic medium 33 having an interface 32 with the piezoelectric transducer 31. A boundary condition for surface wave excitation is defined by the equation:

$$\sin \phi_{ic} = V_1/V_2 \qquad (7)$$

where $V_1$ and $V_2$ are the magnitudes of the velocity of sound, respectfully, in the transducer 31 and acoustic medium 33 and $\phi_{ic}$ is the incident angle of the vector $\vec{A_1}$ on the interface 32 between the transducer 31 and acoustic medium 33. The surface wave acoustic signal can be used to excite a suitable semiconductive device 34, such as a transistor sensitive to mechanical vibrations, into converting an acoustic signal into an electrical signal. The semiconductive device 34 is suitably mounted on the acoustic medium 34 surface transmitting the generated surface wave acoustic signal.

The application of the disclosed apparatus has been illustrated in an efficient microwave delay line using acoustic and optical techniques and the efficient conversion from a microwave signal to a surface wave acoustic signal. Numerous and varied other arrangements can readily be devised in accordance with the disclosed principles.

What is claimed is:

1. An apparatus comprising:
   a piezoelectric material of given dielectric constant in which an electromagnetic signal applied to a nonconductive piezoelectric surface of said material can be made to establish an evanescent electric field,
   an electromagnetic signal propagating means having a dielectric constant greater than said dielectric constant of said piezoelectric material interfaced with said piezoelectric material at said surface to bring about said evanescent electric field within said piezoelectric material, whereby said electromagnetic signal is converted to an acoustic signal.

2. An apparatus according to claim 1, wherein said interface between said propagating means and said piezoelectric material to bring about said evanescent electric field is at a given angle to the propagating direction of said electromagnetic signal, said angle being measured from an axis normal to said nonconductive piezoelectric surface.

3. An apparatus according to claim 2, wherein said angle exceeds a predetermined critical angle, $\theta_{ic}$, defined by the equation:

$$\theta_{ic} = \sin^{-1} \epsilon_2/\epsilon_1$$

where $\epsilon_1$ and $\epsilon_2$ are the dielectric constants, respectfully of said electromagnetic signal propagating means and said piezoelectric material.

4. An apparatus according to claim 2, wherein said angle substantially determines the magnitude of the attenuation constant, $\alpha$, of said piezoelectric's evanescent electric field, said attenuation constant, $\alpha$, defined by the equation:

$$\alpha = (2\pi\sqrt{\epsilon_1})/(\lambda) \quad \sqrt{\sin^2 \theta_i - \epsilon_2/\epsilon_1}$$

where $\epsilon_1$ and $\epsilon_2$ are the relative dielectric constants, respectfully, of said electromagnetic signal propagating means and said piezoelectric material, $\lambda$ is the electromagnetic wavelength at the frequency of said applied electromagnetic signal and $\theta_i$ is the angle between said interface and the propagating direction of said electromagnetic signal, $\theta_i$ being measured from an axis normal to said nonconductive piezoelectric surface.

5. An apparatus according to claim 2, wherein said angle substantially determines the magnitude of the difference in electric potential between said interface and an internal piezoelectric depth located substantially at $\Omega/2$, where $\Omega$ is the acoustic wavelength at the frequency of said applied electromagnetic signal.

6. An apparatus according to claim 1, wherein said electromagnetic signal propagating means comprise a dielectric filled waveguide transmission line, said dielectric having an interface with said piezoelectric material.

7. An acoustic delay line comprising:
   a piezoelectric transducer of given dielectric constant in which an electromagnetic signal applied to a nonconducting piezoelectric surface can be made to establish an evanescent electric field,
   a dielectric filled waveguide transmission line having a dielectric constant greater than said given dielectric constant,
   means for angularly interfacing said nonconductive surface of said transducer to a dielectric surface at one end of said transmission line to bring about said evanescent electric field within said piezoelectric transducer, whereby said electromagnetic signal is converted to an acoustic signal,
   means for interfacing a surface of said piezoelectric transducer to a surface of an acoustic medium, whereby said acoustic signal generated in said transducer is coupled to said acoustic medium,
   means for converting said acoustic signal in said acoustic medium to an electric signal.

* * * * *

UNITED STATES PATENT OFFICE
CERTIFICATE OF CORRECTION

Patent No. 3,710,283 Dated January 9, 1973

Inventor(s) Gerard Argant Alphonse

It is certified that error appears in the above-identified patent and that said Letters Patent are hereby corrected as shown below:

Column 1, line 22, change "conversation" to --conversion--.

Signed and sealed this 29th day of May 1973.

(SEAL)
Attest:

EDWARD M.FLETCHER,JR.
Attesting Officer

ROBERT GOTTSCHALK
Commissioner of Patents